(12) United States Patent
Kamon

(10) Patent No.: US 6,951,004 B2
(45) Date of Patent: Sep. 27, 2005

(54) LAYOUT DATA SAVING METHOD, LAYOUT DATA CONVERTING DEVICE AND GRAPHIC VERIFYING DEVICE

(75) Inventor: Kazuya Kamon, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 319 days.

(21) Appl. No.: 10/341,467

(22) Filed: Jan. 14, 2003

(65) Prior Publication Data

US 2004/0031006 A1 Feb. 12, 2004

(30) Foreign Application Priority Data

Aug. 6, 2002 (JP) ........................................ 2002-228353

(51) Int. Cl.$^7$ ............................................. G06F 17/50
(52) U.S. Cl. .............................. 716/11; 716/9; 716/10
(58) Field of Search ........................................ 716/1–18

(56) References Cited

U.S. PATENT DOCUMENTS

| | | | |
|---|---|---|---|
| 5,481,473 A | | 1/1996 | Kim et al. |
| 5,604,680 A | * | 2/1997 | Bamji et al. .................... 716/8 |
| 5,805,860 A | * | 9/1998 | Parham ........................ 716/12 |
| 6,718,520 B1 | * | 4/2004 | Merryman et al. ............. 716/1 |
| 6,799,307 B1 | * | 9/2004 | Lipton et al. ................... 716/5 |
| 6,842,888 B2 | * | 1/2005 | Roberts ........................ 716/18 |

* cited by examiner

*Primary Examiner*—Matthew Smith
*Assistant Examiner*—Binh Tat
(74) *Attorney, Agent, or Firm*—Oblon, Spivak, McClelland, Maier & Neustadt, P.C.

(57) ABSTRACT

There are saved layout data which have parent cell information indicative of higher order cell data to directly refer to low order cell data (or basic element data), thereby defining a reverse hierarchical structure. More specifically, both of basic element data (figD1 and figD2) have cell data (cell2) as the parent cell information, all of basic element data (figD3 to figD5) have cell data (cell3) as the parent cell information, the cell data (cell3) have two identical cell data (cell2 and cell2) as the parent cell information, and the cell data (cell2) have three identical cell data (cell3, cell3 and cell3) as the parent cell information.

1 Claim, 16 Drawing Sheets

```
figD1    {cell2}
figD2    {cell2}
figD3    {cell3}
figD4    {cell3}
figD5    {cell3}
cell3    {cell2,cell2}
cell2    {cell1,cell1,cell1}
```

```
cell1    {cell2,cell2,cell2}
cell2    {cell3,cell3,figD1,figD2}
cell3    {figD3,figD4,figD5}
```

LAYOUT DATA SAVING METHOD, LAYOUT DATA CONVERTING DEVICE AND GRAPHIC VERIFYING DEVICE

BACKGROUND OF THE INVENTION

1. Field of the Invention

The present invention relates to a method of saving layout data comprising a plurality of basic element data, each of which directly defines a graphic to be a layout pattern of a component of a semiconductor device and a plurality of cell data constructed by a hierarchical structure which can finally refer to the basic element data.

2. Description of the Background Art

Conventionally, data (layout data) having a layout of a circuit pattern of a large scale integrated circuit (LSI) has been saved in the form conforming to a GDS2STREAM format released from CALMA Co., Ltd. The GDS2STREAM format currently spreads widely in the world and has actually become a standard format. In a general applying method, therefore, data are converted into the GDS2STREAM format and are thus transferred to a software manufactured by other companies if necessary.

In the GDS2STREAM format, first of all, a top cell of the highest order hierarchy to be a starting point is specified and graphic data and another cell to which reference is to be made are specified in the top cell. Graphic data and another cell to which reference is to be made are also specified in a cell to which reference has been made. The reference relationship is recursively repeated until a cell (graphic data) in the lowest layer is reached. Accordingly, all data can be processed sequentially by following the hierarchical structure of the cell from the top cell of the highest hierarchy in order. Thus, the GDS2STREAM format has a feature that a whole file is constituted by describing the hierarchical structure.

FIG. 18 is a diagram showing an example in which layout data are saved according to the conventional art. FIG. 19 is a diagram showing a tree structure of the layout data saved in the format illustrated in FIG. 18.

As shown in these drawings, the data present a hierarchical structure. FIG. 18 shows the following description by three cell data cell1 to cell3.

cell1{cell2, cell2, cell2} cell2{figD1, figD2, cell3, cell3} cell3{figD3, figD4, figD5}

It is assumed that figD1 to figD5 are graphic data. The graphic data are also referred to as "basic element data" and actually imply data on one square or one rectangle. For example, an oblong rectangle, a thin vertical rectangle and a small square are piled up so that a transistor can be formed. For respective attributes, the oblong rectangle acts as an active region, the thin vertical rectangle acts as a gate and the small square acts as a contact hole for a source, a gate and a drain. Thus, the basic element data (graphic data) define a graphic to be a layout pattern of a component of a semiconductor device.

In the cell data cell1 of the highest order hierarchy according to the example, reference is made to the lower order cell data cell2 three times. Therefore, the figD1 and figD2 included in the cell2 are used three times. For the cell2, furthermore, reference is made to the lower order cell data cell3 twice. Therefore, the figD3 to figD5 included in the cell3 are used as the cell1 six times. If the data of the cell1 are expanded flatly (into only graphic data), the following flat data can be obtained.

{figD1, figD2, figD3, figD4, figD5, figD3, figD4, figD5, figD1, figD2, figD3, figD4, figD5, figD3, figD4, figD5, figD1, figD2, figD3, figD4, figD5, figD3, figD4, figD5}

Thus, the same graphic data are repetitively described many times. The GDS2STREAM format utilizes the hierarchical structure and therefore has a more compact data structure correspondingly as compared with the example of the flat expansion. This tendency is more remarkable when the same format is used as layout data of an LSI handling large scale data.

Thus, the data format having the hierarchical structure is very efficient because it simply changes the contents of reference of a cell when a work for repetitively using a certain basic graphic or moving and copying a comparatively large data volume is often generated.

In layout data using an ordinary hierarchical structure represented by the GDS2STREAM format, a low order cell and graphic data to which reference is made (which will be hereinafter referred to as a "child cell") are specified in a cell as described above. To the contrary, however, a high order cell to which reference is made (which will be hereinafter referred to as a "parent cell") is not specified in the cell. More specifically, cell data from a high order to a low order are specified to implement the hierarchical structure.

In order to check a range in which higher order cells are influenced when an inner part of a certain cell is corrected, therefore, it is necessary to expand and check data by reversely following all the hierarchical structures one by one. For the use in which a mutual positional relationship between graphics included in separate cells is taken into consideration, moreover, it is necessary to once expand a hierarchical structure to form a flat data structure. For this reason, a processing efficiency is reduced as compared with that in flat data originally having no hierarchical structure. The layout data volume of an LSI becomes enormous. Therefore, there is a problem in that a capacity of a storage device such as a disk or a memory is exceeded and a normal processing cannot be carried out when the hierarchical structure is to be expanded to generate flat data.

In order to eliminate such a drawback, it is necessary to have special know-how, for example, to take note of the reference relationship between cells in a layout data design stage or to take care that the cells do not overlap with adjacent cells.

SUMMARY OF THE INVENTION

It is an object of the present invention to provide a method of saving layout data having a structure in which an influence exerted wholly by a change in a graphic and the like defined by basic element data can be checked comparatively easily.

A first aspect of the present invention is directed to a method of saving layout data including a plurality of basic element data, each of which directly defines a graphic to be a layout pattern of a component of a semiconductor device and a plurality of cell data constructed by a hierarchical structure such that reference can be finally made to the basic element data. In the layout data saving method, the layout data is saved in such a format as to define the hierarchical structure in a reverse direction from a low order to a high order by relating to parent cell information indicative of high order cell data to which reference is directly made to each of the plurality of basic element data and the plurality of cell data.

The layout data saving method serves to define and save the hierarchical structure in the reverse direction defining a hierarchical relationship from a low order to a high order. By sequentially retrieving the cell data in a higher order hierarchy with the parent cell information of the basic element data set to be a starting point, consequently, it is possible to comparatively easily check an influence exerted wholly by a change in a graphic and the like defined by the basic element data.

A second aspect of the present invention is directed to a layout data converting device for converting first type layout data into second type layout data. The first type and second type layout data have a plurality of basic element data, each of which directly defines a graphic to be a layout pattern of a component of a semiconductor device and a plurality of cell data constructed by a hierarchical structure such that reference can be finally made to the basic element data, respectively. Each of the plurality of the cell data in the first type layout data have child cell information indicative of low order cell data or the basic element data to which reference is directly made, thereby defining the hierarchical structure in a positive direction. Each of the plurality of the basic element data and the plurality of cell data in the second type layout data have parent cell information indicative of high order cell data to which reference is directly made, thereby defining the hierarchical structure in a reverse direction. The layout data converting device includes a hierarchical structure analyzing section and a reverse hierarchical structure generating section. The hierarchical structure analyzing section analyzes the hierarchical structure based on the child cell information of the first type layout data. The reverse hierarchical structure generating section adds the parent cell information to each of the plurality of basic element data and the plurality of cell data respectively to generate the second type layout data based on a result of analysis carried out by the hierarchical structure analyzing section.

The layout data converting device can convert the first type layout data into the second type layout data. Therefore, it is possible to effectively utilize the existing first type layout data as the second type layout data.

A third aspect of the present invention is directed to a layout data converting device for converting second type layout data into first type layout data. The first type and second type layout data have a plurality of basic element data, each of which directly defines a graphic to be a layout pattern of a component of a semiconductor device and a plurality of cell data constructed by a hierarchical structure such that reference can be finally made to the basic element data. Each of the plurality of the cell data in the first type layout data have child cell information indicative of low order cell data or the basic element data to which reference is directly made, thereby defining the hierarchical structure in a positive direction. Each of the plurality of the basic element data and the plurality of cell data in the second type layout data have parent cell information indicative of high order cell data to which reference is directly made, thereby defining the hierarchical structure in a reverse direction. The layout data converting device includes a reverse hierarchical structure analyzing section and a hierarchical structure generating section. The reverse hierarchical structure analyzing section analyzes the hierarchical structure based on the parent cell information of the second type layout data. The hierarchical structure generating section adds the child cell information to each of the plurality of cell data respectively to generate the first type layout data based on a result of analysis carried out by the reverse hierarchical structure analyzing section.

The layout data converting device can convert the second type layout data into the first type layout data. Therefore, it is possible to obtain a compatibility of the existing first type layout data and the second type layout data defining the hierarchical structure in the reverse direction.

A fourth aspect of the present invention is directed to a graphic verifying device for carrying out a graphic verification processing based on layout data. The layout data have a plurality of basic element data, each of which directly defines a graphic to be a layout pattern of a component of a semiconductor device and a plurality of cell data constructed by a hierarchical structure such that reference can be finally made to the basic element data. Each of the plurality of basic element data and the plurality of cell data have parent cell information to be information about high order cell data to which reference is directly made, thereby defining the hierarchical structure in a reverse direction. The graphic verifying device includes a reverse hierarchical structure analyzing section and a graphic verifying section. The reverse hierarchical structure analyzing section analyzes the hierarchical structure based on the parent cell information of the layout data. The graphic verifying section carries out a verification processing based on an occupied region on an actual space region of a graphic defined by the plurality of basic element data on the basis of a result of analysis performed by the hierarchical structure analyzing section.

The graphic verifying device can comparatively easily recognize the occupied region on the actual space region of the graphic defined by the basic element data by sequentially retrieving the high order cell data with the parent cell information of the basic element data set to be a starting point. Thus, a graphic can be verified efficiently.

These and other objects, features, aspects and advantages of the present invention will become more apparent from the following detailed description of the present invention when taken in conjunction with the accompanying drawings.

DESCRIPTION OF THE PREFERRED EMBODIMENTS

<First Embodiment>

Figure 1:
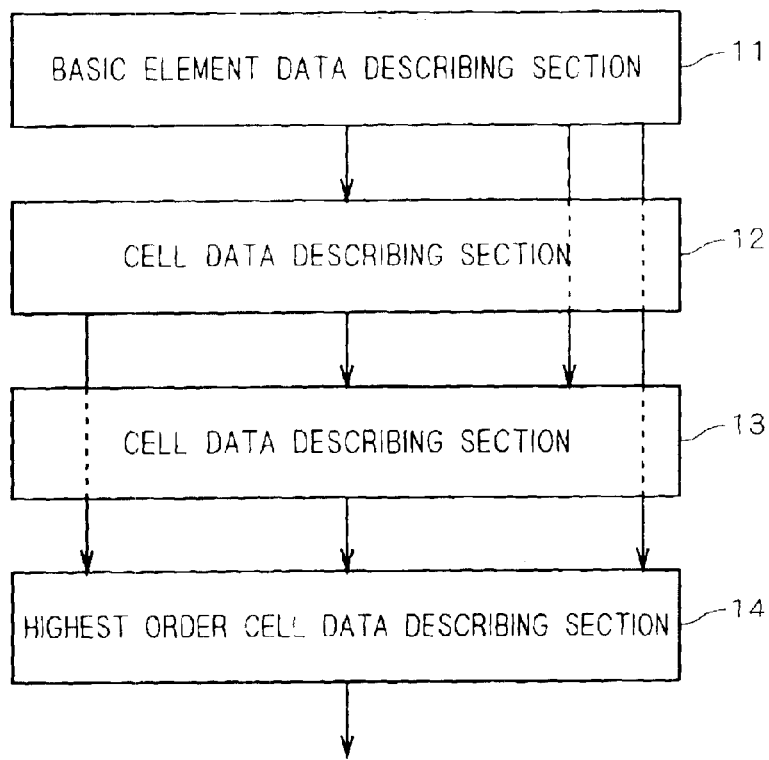
FIG. 1 is a diagram showing a method of saving layout data according to a first embodiment of the present invention.

FIG. 1 is a diagram showing a layout data saving format according to a first embodiment of the present invention. An arrow in FIG. 1 indicates a reference direction. As shown in FIG. 1, there is presented a hierarchical structure from a low order to a high order in order of a basic element data describing section 11, a cell data describing section 12, a cell data describing section 13 and a highest order cell data describing section 14.

Reference is directly made to the basic element data describing section 11 from the cell data describing section 12, the cell data describing section 13 or the highest order cell data describing section 14, and the basic element data describing section 11 has parent cell information (corresponding to the arrow in FIG. 1) indicative of high order cell data to which reference is directly made.

Reference is directly made to the cell data describing section 12 from the cell data describing section 13 or the highest order cell data describing section 14, and the cell data describing section 12 has parent cell information indicative of high order cell data to which reference is directly made.

Reference is directly made to the cell data describing section 13 from another cell data describing section 13 or the highest order cell data describing section 14, and the cell data describing section 13 has parent cell information indicative of high order cell data to which reference is directly made.

The highest order cell data describing section 14 does not have the parent cell information because of the highest hierarchy.

In the layout data saving format according to the first embodiment, thus, saving is carried out with a reverse hierarchical structure in which a hierarchical relationship is clear from a low order to a high order in a reverse direction to that in the conventional art. In this specification, a direction from the high order to the low order and a direction from the low order to the high order in the hierarchical structure will be hereinafter referred to as positive and reverse directions, respectively.

Figure 2:
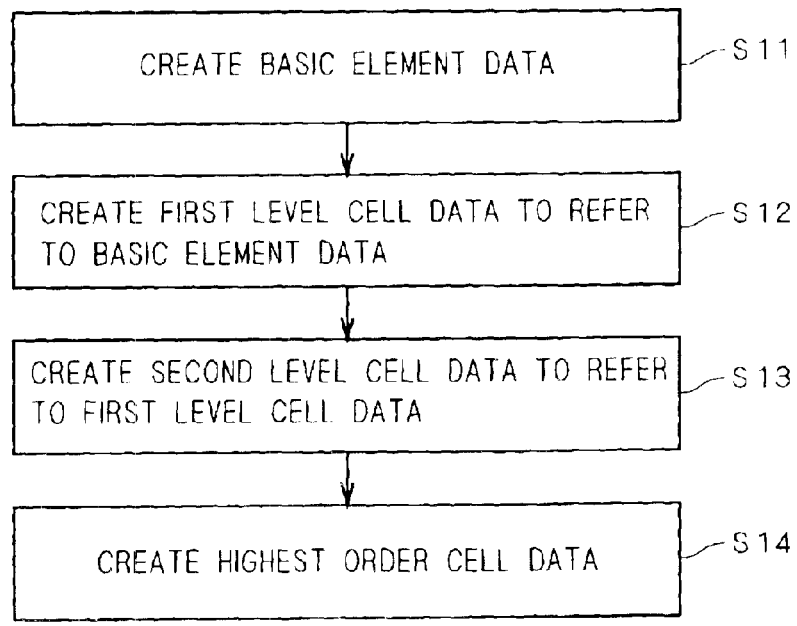
FIG. 2 is a flow chart showing a method of generating layout data having a reverse hierarchical structure.

FIG. 2 is a flow chart showing a method of generating layout data having the reverse hierarchical structure. With reference to FIG. 2, description will be given to an operation for generating a layout data structure according to the first embodiment.

At a step S11, basic element data DP are created. The basic element data DP are graphic data and have parent cell information indicative of high order cell data to which reference is directly made in order to satisfy the reverse hierarchical structure in addition to information and an attribute which indicate a graphic itself in the same manner as in the conventional art. The basic element data DP correspond to the basic element data describing section 11.

At a step S12, first level cell data CL1 to refer to the basic element data DP are described. The first level cell data CL1 do not include child cell information indicative of a hierarchical relationship with the basic element data DP to which reference is to be made, and instead include parent cell information indicative of high order cell data to which reference is directly made.

Examples of the first level cell data CL1 include cells having a basic logical function such as AND, OR, NOT and NAND with reference to one or more basic element data DP.

At a step S13, second level cell data CL2 to refer to the first level cell data CL1 are described. The second level cell data CL2 do not include child cell information indicative of a hierarchical relationship with the first level cell data CL1 to which reference is to be made but include parent cell information indicative of high order cell data to which reference is directly made. There is a possibility that other second level cell data CL2 might refer to the second level cell data CL2. Therefore, an operation for describing the second level cell data CL2 by the cell data describing section 13 is executed recursively.

Examples of the second level cell data CL2 include a cell to be a command having a higher function in combination with the first level cell data CL1 and the basic element data DP. Moreover, the second level cell data CL2 may partially refer to the basic element data DP.

At a step S14, finally, the highest level cell data CLX to which any cell does not refer are described. In some cases, the first level cell data CL1 and the second level cell data CL2 act as the highest level cell data CLX.

The basic element data DP, the first level cell data CL1, the second level cell data CL2 and the highest level cell data CLX have region information for defining sizes, origin positions and the like on spaces prescribed by themselves.

Thus, the layout data to be saved in the layout data saving format according to the first embodiment present the reverse hierarchical structure in which cell data have parent cell information.

Figures 3, 4:
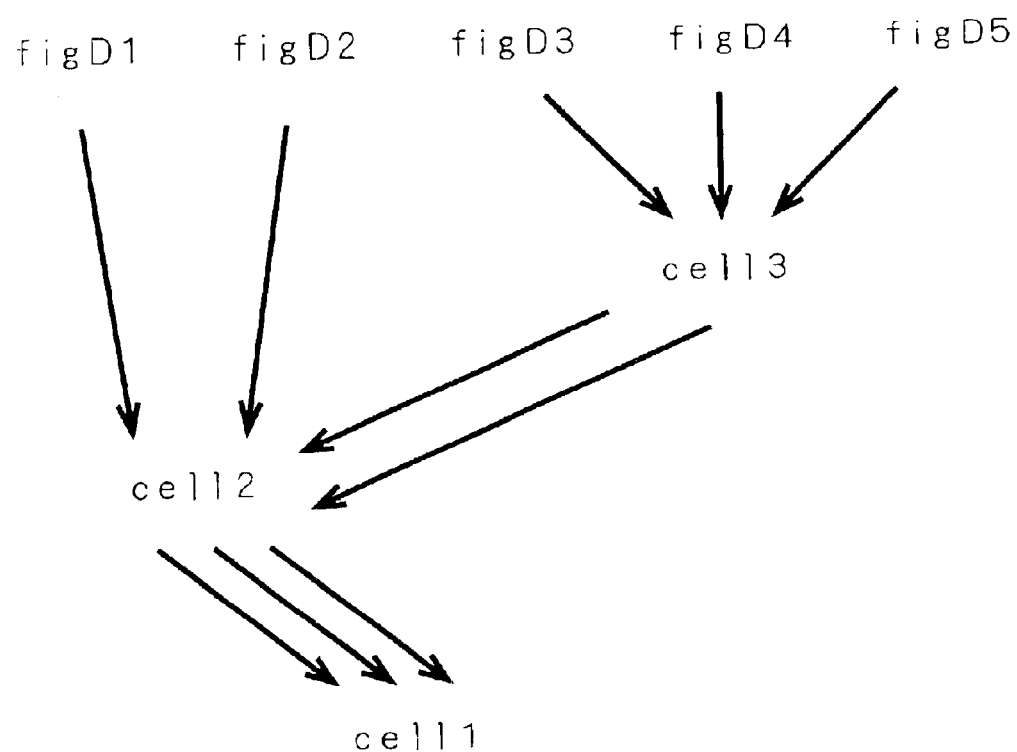
FIG. 3 is a diagram showing a layout data saving state according to the first embodiment.
FIG. 4 is a diagram showing, in a tree format, the layout data saving state according to the first embodiment.
Figures 18, 19:
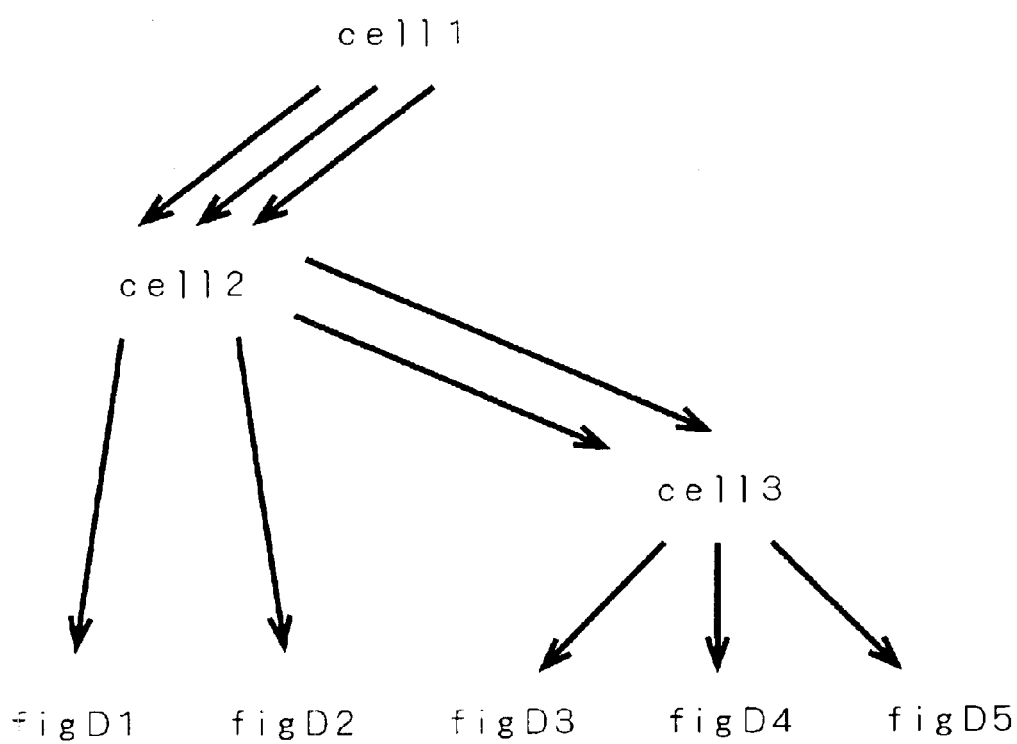
FIG. 18 is a diagram showing a layout data saving state according to the conventional art.
FIG. 19 is a diagram showing, in a tree format, the layout data saving state according to the conventional art.

FIG. 3 is a diagram showing the layout data saving state according to the first embodiment. FIG. 4 is a diagram showing a tree structure of layout data saved in the format illustrated in FIG. 3. The layout data shown in FIGS. 3 and 4 correspond to layout data shown in FIGS. 18 and 19.

As shown in FIGS. 3 and 4, cell data (including basic element data) have parent cell information indicative of high order cell data to which reference is to be directly made. More specifically, both of basic element data figD1 and figD2 have cell data cell2 as parent cell information, all of basic element data figD3 to figD5 have cell data cell3 as the parent cell information, the cell data cell3 have two identical cell data cell2 and cell2 as the parent cell information, and the cell data cell2 have three identical cell data cell1, cell1 and cell as the parent cell information.

Accordingly, it is apparent that the figD4 can efficiently and accurately recognize a relationship with all the cell data to which reference is to be made (the cell3 (to which reference is once made), the cell2 (to which reference is made twice through the cell3) and the cell1 (to which reference is made six times through the cell2 and the cell3)) by setting the parent cell information (cell3) of the figD4 to be a starting point.

In the case in which a graphic of the basic element data DP is corrected, the correction reaches all the cells which refer to the basic element data DP directly or indirectly. In a conventional method of saving layout data having a hierarchical structure, only a hierarchical relationship in the positive direction is defined. Therefore, it is hard to correctly grasp an influence exerted wholly by the correction of the basic element data DP in the lowest level.

In the layout data saving format according to the first embodiment, however, the hierarchical relationship is defined in a reverse direction. Therefore, the retrieval is carried out by setting the parent cell information of the basic element data DP as a starting point. Consequently, it is possible to efficiently and accurately recognize the influence exerted wholly by the correction of the basic element data DP.

Figure 5:
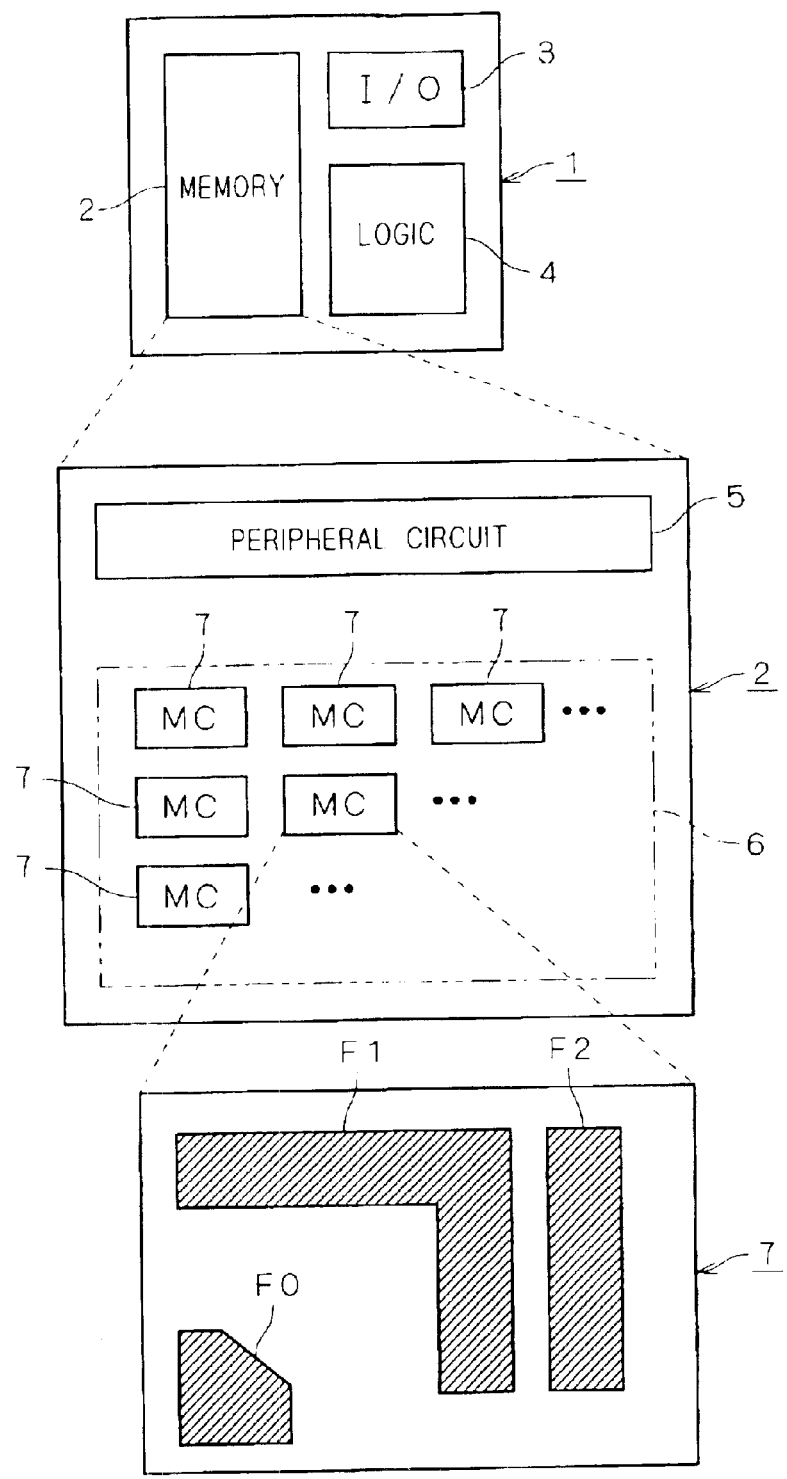
FIG. 5 is a diagram illustrating a hierarchical structure in layout data.

FIG. 5 is a diagram illustrating the hierarchical structure in the layout data. In the example of FIG. 5, a semiconductor chip 1 to be the highest order cell data is provided with a memory 2, an input/output interface 3 and a logic circuit 4 to be lower order cell data thereof. Furthermore, the memory 2 is provided with a peripheral circuit 5 and a memory cell array 6 to be lower order cell data thereof, and a large number of memory cells 7 to be lower order cell data are provided in a matrix on the memory cell array 6. The memory cell 7 is provided with basic elements F0, F1 and F2 to be graphics defined by basic element data positioned in the lowest order of the hierarchical structure.

For example, in the case in which the basic element data F2 are changed, an influence exerted on the semiconductor chip 1 through the memory cell array 6 (all the memory cells 7) and the memory 2 can be recognized comparatively easily by following the parent cell information with the parent cell information of the basic element data F2 set to be a starting point in the layout data having the reverse hierarchical structure according to the first embodiment.

<Second Embodiment>

Figure 6:
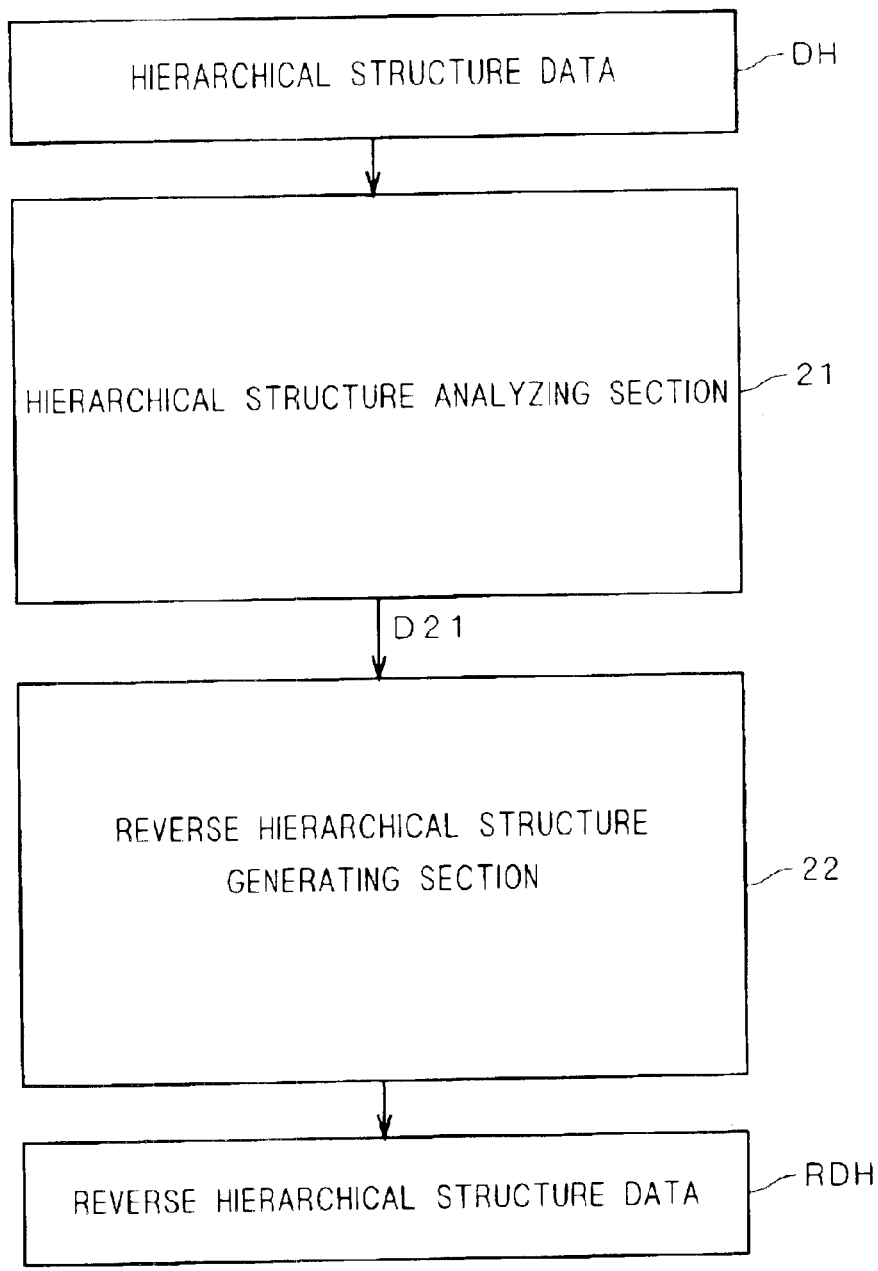
FIG. 6 is a block diagram showing a structure of a layout data converting device according to a second embodiment of the present invention.

FIG. 6 is a block diagram showing a structure of a layout data converting device according to a second embodiment of the present invention.

As shown in FIG. 6, a hierarchical structure analyzing section 21 analyzes a hierarchical structure based on hierarchical structure layout data DH and outputs hierarchical structure analyzing information D21. A reverse hierarchical structure generating section 22 outputs reverse hierarchical structure layout data RDH based on the hierarchical structure analyzing information D21.

Figure 7:
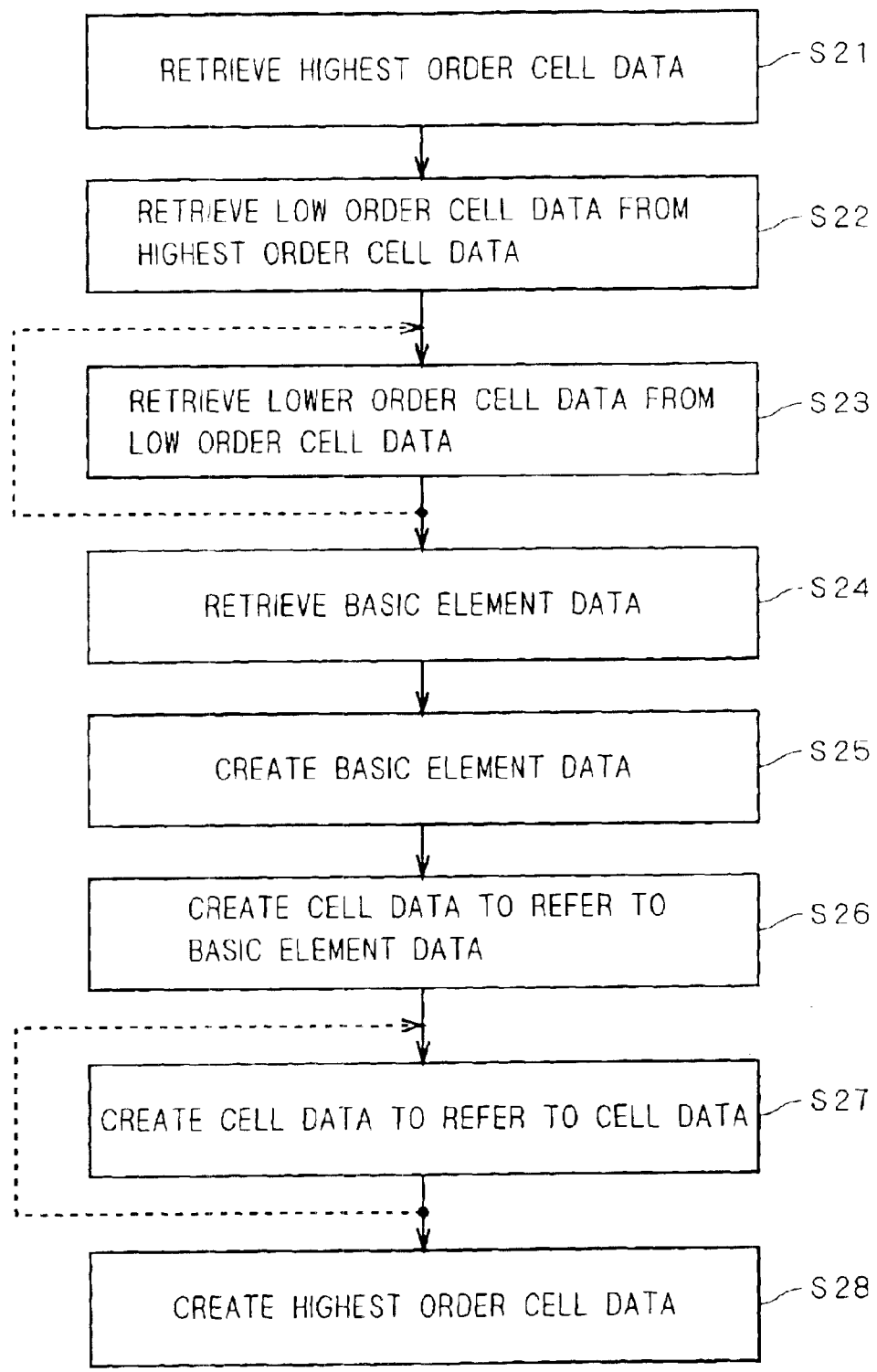
FIG. 7 is a flow chart showing an operation of the layout data converting device according to the second embodiment.

FIG. 7 is a flow chart showing an operation of the layout data converting device according to the second embodiment. With reference to FIG. 7, the converting operation will be described below. First of all, description will be given to a hierarchical structure analyzing operation to be carried out by the hierarchical structure analyzing section 21.

First of all, the highest order cell data are retrieved from the hierarchical structure layout data DH at a step S21 and low order cell data are retrieved from child cell information of the highest order cell data at a step S22.

Then, lower order hierarchical data are retrieved from the child cell information of the low order cell data detected at the step S22. In the case in which the low order cell data thus retrieved further have cell data as child cell information, a processing of a step S23 is executed recursively.

Thereafter, basic element data are retrieved as the lowest order cell data at a step S24. Under certain circumstances, the basic element data are retrieved after the execution of the steps S21 and S22.

After the steps S21 to S24, the hierarchical structure analyzing section 21 obtains the hierarchical structure analyzing information D21 including a hierarchical relationship (a parent—child relationship) of all the basic element data and cell data and inherent information in the cell data.

Next, there is started an operation for generating the reverse hierarchical structure layout data RDH based on the hierarchical structure analyzing information D21 which is to be carried out by the reverse hierarchical structure generating section 22.

At a step S25, basic element data are created. Inherent information such as information about graphic data in the basic element data is the same as that of the hierarchical structure layout data DH. By newly adding parent cell information indicative of high order cell data to which reference is directly made, basic element data having a reverse hierarchical structure are created.

Then, cell data to refer to the basic element data are created at a step S26. In this case, the cell data do not have child cell information indicative of a hierarchical relationship with the basic element data and parent cell information indicative of high order cell data to which reference is directly made is added.

At a step S27, next, cell data to refer to the cell data are created. In this case, the generated cell data do not have the child cell information indicative of the hierarchical relationship with the cell data to which reference is to be made and parent cell information indicative of high order cell data to which reference is directly made is added. In the case in which other cell data further refer to the generated cell data, the processing of the step S27 is executed recursively.

Then, the highest order cell data are generated at a step S28. The highest order cell data do not have the child cell information.

Thus, the layout data converting device according to the second embodiment can convert the hierarchical structure layout data DH into the reverse hierarchical structure layout data RDH. Therefore, it is possible to practically use existing hierarchical structure layout data as reverse hierarchical structure layout data.

A large number of existing designed layout data are saved as the hierarchical structure layout data based on a GDS2STREAM format. By the layout data converting device according to the second embodiment, therefore, it is possible to maintain a compatibility with the existing hierarchical structure layout data. If the compatibility can be maintained, it is also possible to properly use a conventional hierarchical structure and the reverse hierarchical structure according to the present invention if necessary.

<Third Embodiment>

Figure 8:
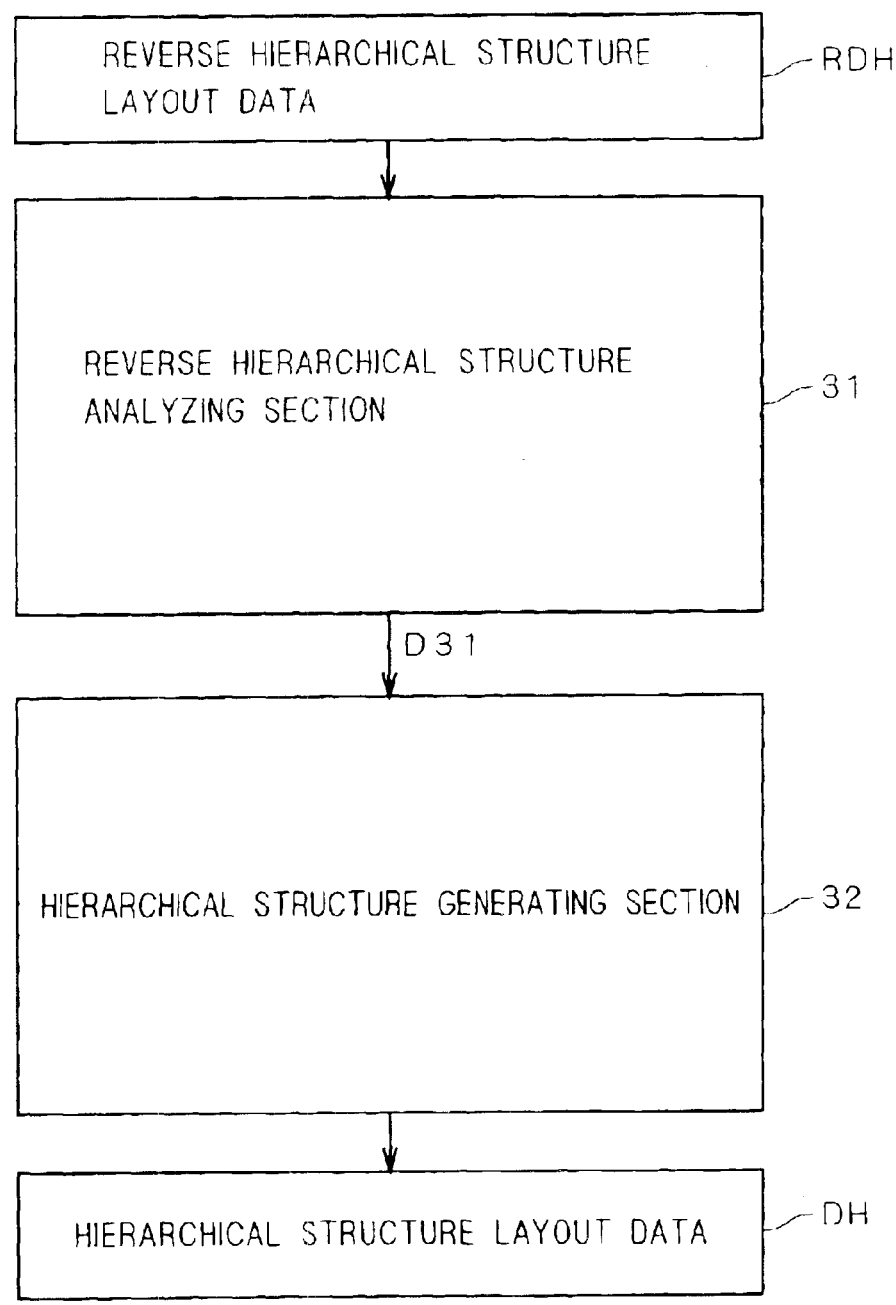
FIG. 8 is a block diagram showing a structure of a layout data converting device according to a third embodiment of the present invention.

FIG. 8 is a block diagram showing a structure of a layout data converting device according to a third embodiment of the present invention.

As shown in FIG. 8, a reverse hierarchical structure analyzing section 31 analyzes a reverse hierarchical structure based on reverse hierarchical structure layout data RDH and outputs reverse hierarchical structure analyzing information D31. A hierarchical structure generating section 32 outputs hierarchical structure layout data DH based on the reverse hierarchical structure analyzing information D31.

Figure 9:
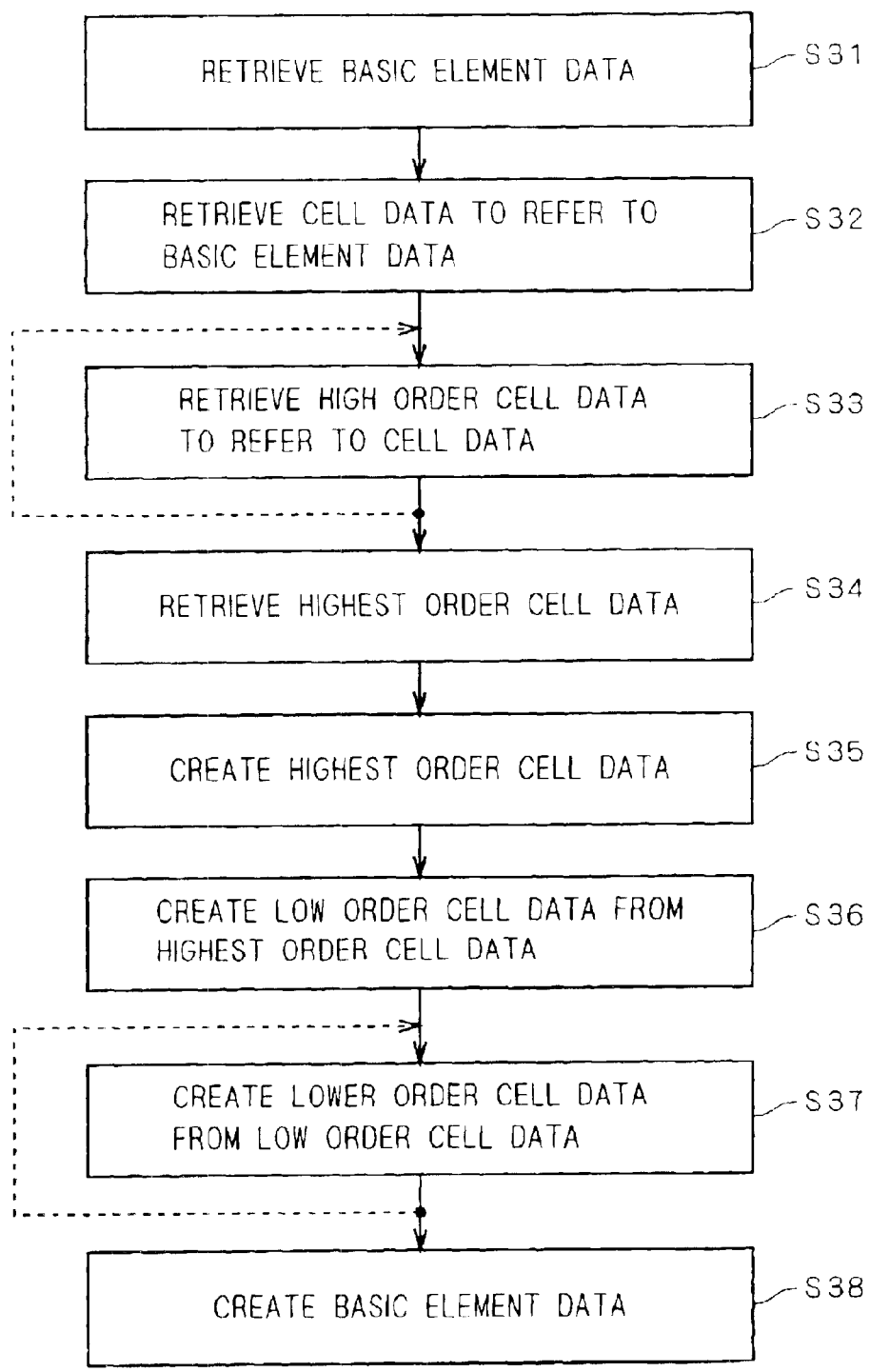
FIG. 9 is a flow chart showing an operation of the layout data converting device according to the third embodiment.

FIG. 9 is a flow chart showing an operation of the layout data converting device according to the third embodiment. With reference to FIG. 9, the converting operation will be described below. First of all, description will be given to a reverse hierarchical structure analyzing operation to be carried out by the reverse hierarchical structure analyzing section 31.

First of all, basic element data are retrieved from the reverse hierarchical structure layout data RDH at a step S31 and cell data to refer to the basic element data are retrieved from parent cell information of the basic element data at a step S32.

Then, higher order cell data are retrieved from the parent cell information of the cell data detected at the step S32. In the case in which the higher order cell data thus retrieved further have cell data as parent cell information, a processing of a step S33 is executed recursively.

Thereafter, the highest order cell data are retrieved by following the parent cell information of the cell data at a step S34. Under certain circumstances, the highest order cell data are retrieved after the execution of the steps S31 and S32.

After the steps S31 to S34, the reverse hierarchical structure analyzing section 31 obtains the reverse hierarchical structure analyzing information D31 including a hierarchical relationship (a parent—child relationship) of all the cell data and inherent information in the cell data.

Next, there is started an operation for generating the hierarchical structure layout data DH based on the reverse hierarchical structure analyzing information D31 which is to be carried out by the hierarchical structure generating section 32.

At a step S35, the highest order cell data are created. In this case, child cell information is added, thereby creating the highest order cell data based on an existing hierarchical structure.

Then, low order cell data are created by referring to the child cell information of the highest order cell at a step S36. In this case, the child cell information to be information about the cell data to which reference is to be made is added to the cell data.

Next, lower order cell data are created by referring to the child cell information of the cell data at a step S37. In this case, child cell information indicative of cell data to which reference is to be made is added. In the case in which child cell information of the generated cell data has other cell data, the processing of the step S37 is executed recursively.

Then, basic element data are generated at a step S38.

Thus, the layout data converting device according to the third embodiment can convert the reverse hierarchical structure layout data RDH into the hierarchical structure layout data DH. Therefore, it is possible to maintain a compatibility with existing hierarchical structure layout data. If the compatibility can be maintained, it is also possible to properly use a conventional hierarchical structure and the reverse hierarchical structure according to the present invention if necessary.

<Fourth Embodiment>

Figure 10:
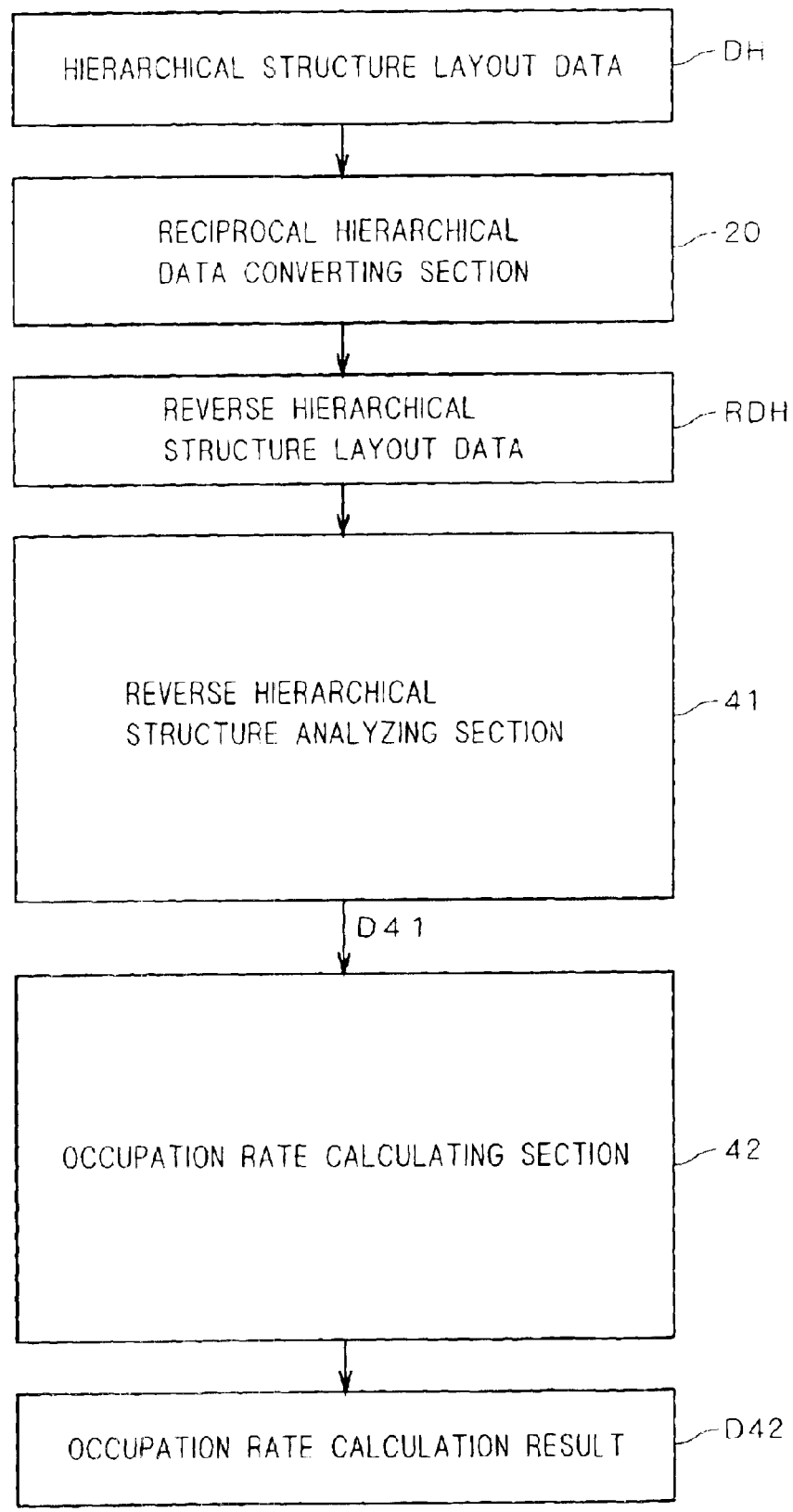
FIG. 10 is a block diagram showing a structure of an occupation rate analyzing device according to a fourth embodiment of the present invention.

FIG. 10 is a block diagram showing a structure of an occupation rate analyzing device according to a fourth embodiment of the present invention. As shown in FIG. 10, a reverse hierarchical structure analyzing section 41 receives reverse hierarchical structure layout data RDH and outputs reverse hierarchical structure analyzing information D41 based on the reverse hierarchical structure layout data RDH. An occupation rate calculating section 42 to be a graphic verifying section outputs an occupation rate calculation result D42 based on the reverse hierarchical structure analyzing information D41.

The occupation rate analyzing device may employ a structure in which the reverse hierarchical structure layout data RDH are directly used or a structure in which the reverse hierarchical structure layout data RDH obtained by converting existing hierarchical structure layout data DH by means of a reciprocal hierarchical data converting section 20 are used as shown in FIG. 10. The layout data converting device according to the second embodiment corresponds to the reciprocal hierarchical data converting section 20.

Figure 11:
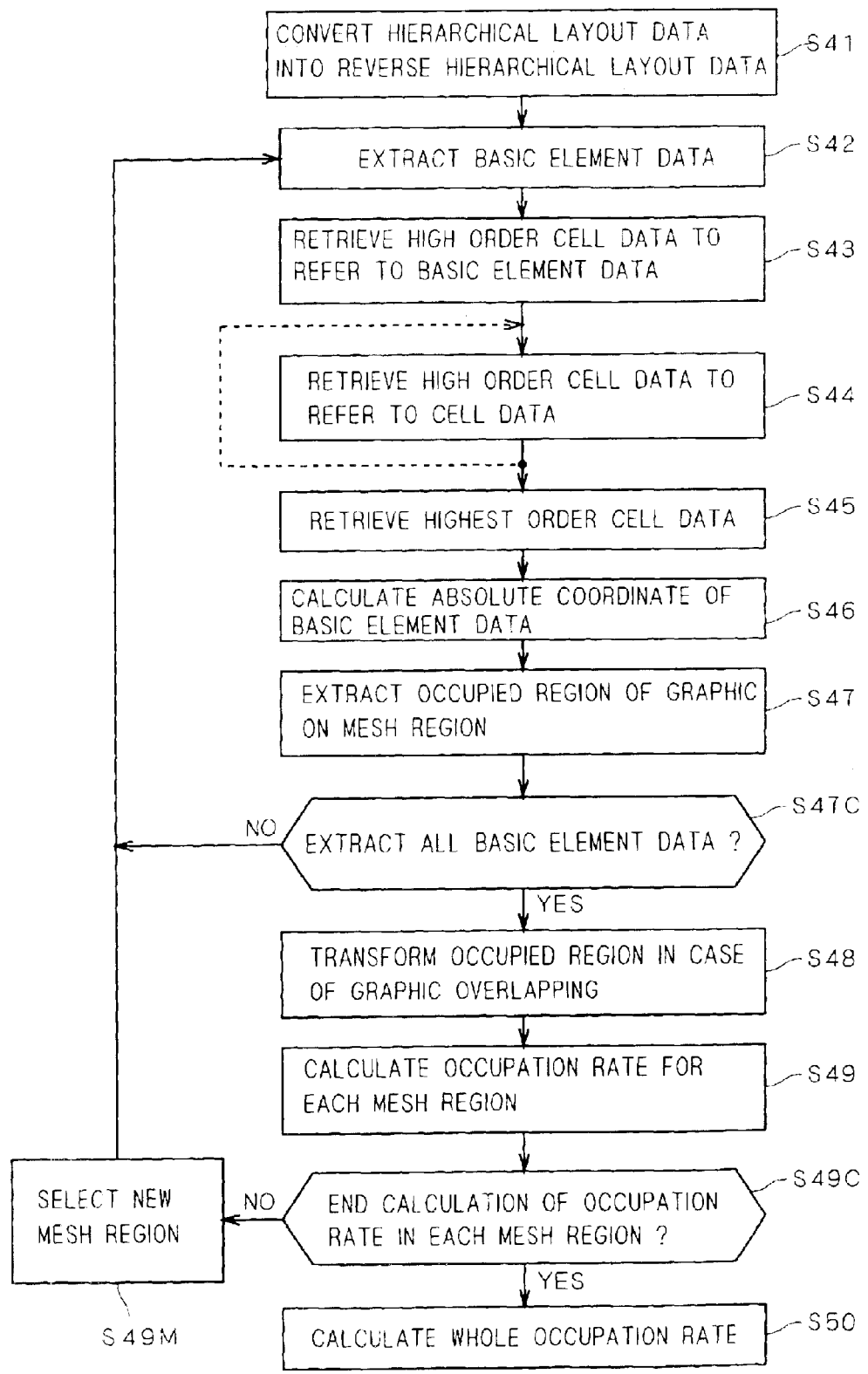
FIG. 11 is a flow chart showing an occupation rate calculating operation of the occupation rate analyzing device according to the fourth embodiment.

FIG. 11 is a flow chart showing an occupation rate calculating operation of the occupation rate analyzing device according to the fourth embodiment. FIG. 11 corresponds to the structure of FIG. 10 in which the existing hierarchical structure layout data DH are utilized. With reference to FIG. 11, description will be given to the occupation rate calculating operation.

First of all, the hierarchical structure layout data DH are converted into reverse hierarchical structure layout data RDH by the reciprocal hierarchical data converting section 20 at a step S41.

Subsequently, a reverse hierarchical structure analysis processing based on the reverse hierarchical structure layout data RDH is carried out by the reverse hierarchical structure analyzing section 41.

First of all, basic element data are extracted at a step S42.

At a step S43, next, high order cell data are retrieved based on parent cell information of the basic element data.

At a step S44, furthermore, high order cell data are retrieved based on parent cell information of the cell data. If parent cell data of the cell data thus retrieved are present, the processing of the step S44 is executed recursively.

At a step S45, then, the highest order cell data are finally retrieved by following the parent cell information. Depending on a structure of the reverse hierarchical structure layout data RDH, the step S45 is executed immediately after the execution of the steps S42 and S43 in some cases.

When the highest order cell data are retrieved, an actual space region to be defined by the highest order cell data is determined. A graphic defined by at least one basic element data is used in the actual space region. Therefore, the actual space region becomes an object of the occupation rate calculation to be one of graphic verifications.

Subsequently, there is started an occupation rate calculation processing based on the reverse hierarchical structure analyzing information D41 which is to be carried out by the occupation rate calculating section 42. In the present embodiment, a processing is executed on a mesh region unit on the assumption that the actual space region is constituted by a plurality of mesh regions.

First of all, at a step S46, absolute coordinates of a graphic defined by basic element data are calculated. A coordinate position of the graphic defined by the basic element data on the actual space region is determined based on region information about all the cell data from the basic element data to the highest order cell data.

For instance, in the example of FIG. 5, absolute coordinates on which a graphic defined by basic element data F2 is present are not decided until a hierarchical structure comprising a memory cell 7, a memory cell array 6, a memory 2 and a semiconductor chip 1 becomes clear, and a predetermined position of the predetermined memory cell 7 in the memory cell array 6 of the memory 2 formed on the semiconductor chip 1 is set to be a position in which the basic element data F2 are to be formed.

At a step S47, a region in which a selected mesh region overlaps a graphic having absolute coordinates decided at the step S46 is extracted as an occupied region of a graphic on the mesh region.

At a step S47C, presence (Yes/No) of the extraction of all the basic element data is checked. If the basic element data are not extracted, the processing returns to the step S42. Subsequently, the processing of the steps S42 to S47 is repeated for all the basic element data and a decision of Yes is then obtained at the step S47C, and the processing proceeds to a step S48.

At the step S48, in the case in which two graphics overlap each other on the same region, an occupied region transformation processing of removing an overlapping portion from an occupied region of one of the graphics is carried out.

At a step S49, next, an occupation rate in the selected mesh region is calculated based on a total area of the occupied region obtained through the steps S47 and S48. In this case, at the step S48, the occupied region transformation processing is carried out. Also in the case in which two or more graphics occupy the same region, therefore, an occupied region of each graphic is simply added so that the total area of the occupied region can be obtained accurately.

Then, presence of an end of the calculation of occupation rates in all the mesh regions is checked at a step S49C. Moreover, if it is decided that there is a mesh region in which the calculation is not ended, a new mesh region is selected at a step S49M and the processing then returns to the step S42.

Thereafter, when it is decided that the calculation of the occupation rates in all the mesh regions is ended at the step S49C, the calculation of the whole occupation rate is carried out based on the occupation rate in each of all the mesh regions at a step S50 and the processing is ended.

In the case in which the occupation rate is to be calculated based on the existing hierarchical structure layout data DH, it is necessary to cause a hierarchy to sequentially descend from high order cell data, to retrieve basic element data and to then follow the hierarchy to the highest order, thereby carrying out the same calculation as that in the steps S42 to S50.

In this case, it is necessary to once expand a hierarchical structure into flat data. Therefore, a processing time required for the expansion and an intermediate file (a work region) become enormous so that the processing cannot be carried out in some cases.

On the other hand, in the present embodiment, the basic element data of the reverse hierarchical structure layout data RDH are used. Therefore, the processing is started from the basic element data and high order cell data are easily followed. Consequently, a processing of retrieving cell data can easily be carried out so that occupation rate calculation can be performed at a high speed.

In a fourth embodiment, moreover, there is provided the reciprocal hierarchical data converting section 20 for converting the hierarchical structure layout data DH into the reverse hierarchical structure layout data RDH. Therefore, it is possible to calculate an occupation rate at a high speed in the same manner also in the case in which the hierarchical structure layout data DH are given.

<Fifth Embodiment>

Figure 12:
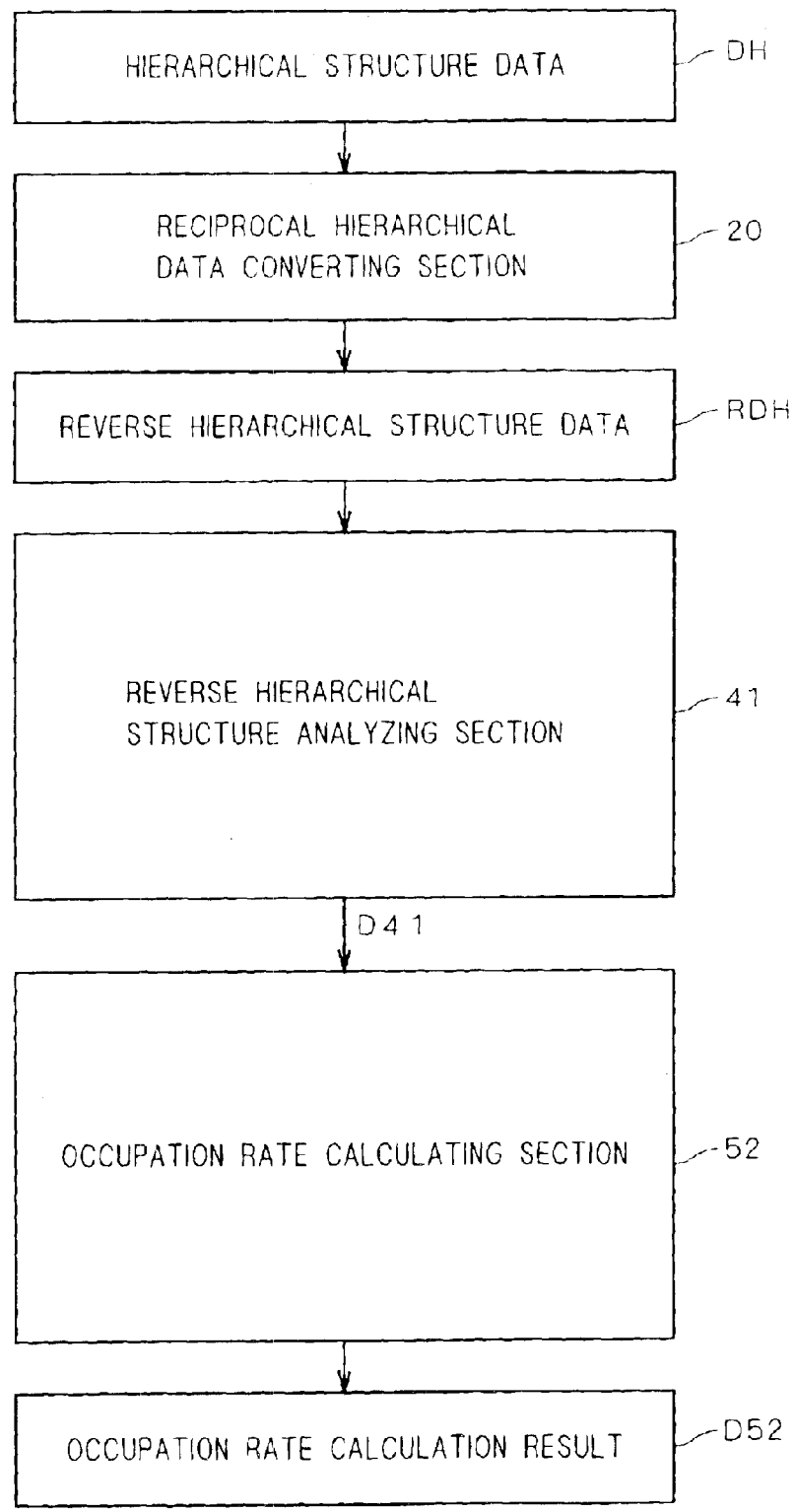
FIG. 12 is a block diagram showing a structure of an occupation rate analyzing device according to a fifth embodiment of the present invention.

FIG. 12 is a block diagram showing a structure of an occupation rate analyzing device according to a fifth embodiment of the present invention. As shown in FIG. 12, a reverse hierarchical structure analyzing section 41 receives reverse hierarchical structure layout data RDH and outputs reverse hierarchical structure analyzing information D41 based on the reverse hierarchical structure layout data RDH. An occupation rate calculating section 52 outputs an occupation rate calculation result D52 based on the reverse hierarchical structure analyzing information D41.

The occupation rate analyzing device may employ a structure in which the reverse hierarchical structure layout data RDH are directly used or a structure in which the reverse hierarchical structure layout data RDH obtained by converting existing hierarchical structure layout data DH by means of a reciprocal hierarchical data converting section 20 are used as shown in FIG. 12. The layout data converting device according to the second embodiment corresponds to the reciprocal hierarchical data converting section 20.

Figure 13:
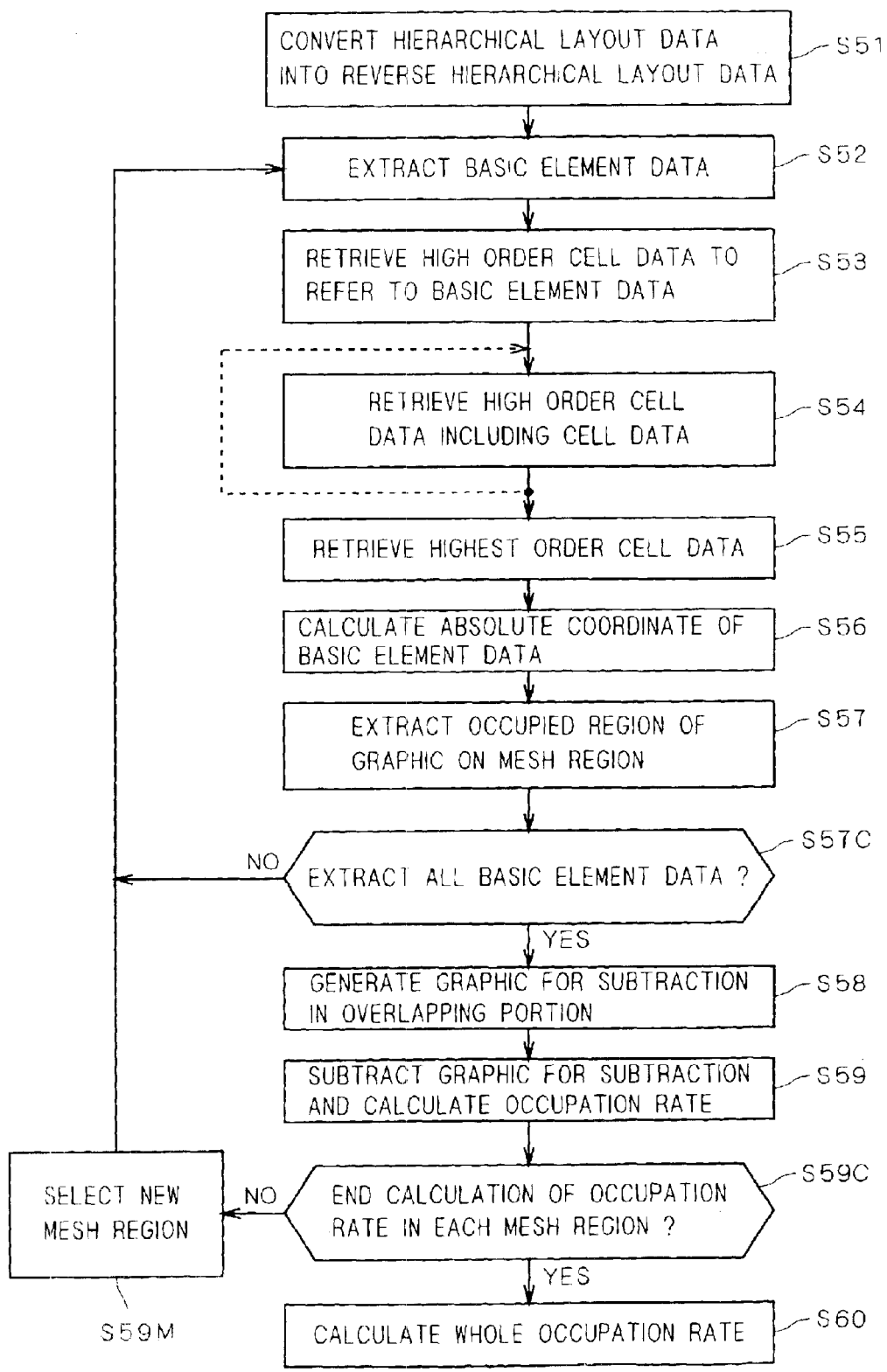
FIG. 13 is a flow chart showing an occupation rate calculating operation of the occupation rate analyzing device according to the fifth embodiment.

FIG. 13 is a flow chart showing an occupation rate calculating operation of the occupation rate analyzing device according to the fifth embodiment. FIG. 13 corresponds to the structure of FIG. 12 utilizing the existing hierarchical structure layout data DH. With reference to FIG. 13, the occupation rate calculating operation will be described below.

First of all, at a step S51, the hierarchical structure layout data DH are converted into the reverse hierarchical structure layout data RDH by the reciprocal hierarchical data converting section 20.

Subsequently, the same reverse hierarchical structure analysis processing as that of the fourth embodiment is carried out based on the reverse hierarchical structure layout data RDH by the reverse hierarchical structure analyzing section 41. More specifically, the contents of the processing of steps S52 to S55 in FIG. 13 are the same as those of the steps S42 to S45 in FIG. 11.

When the highest order cell data are retrieved at the step S55, an actual space region to be defined by the highest order cell data is determined. A graphic defined by at least one basic element data is used in the actual space region. Therefore, the actual space region becomes an object of the occupation rate calculation.

Subsequently, there is started an occupation rate calculation processing based on the reverse hierarchical structure analyzing information D41 which is to be carried out by the occupation rate calculating section 52.

First of all, at a step S56, absolute coordinates of the basic element data are calculated. Absolute coordinate positions of a graphic defined by the basic element data on an actual space region are determined based on region information about all the cell data from the basic element data to the highest order cell data.

At a step S57, a region in which a selected mesh region overlaps a graphic having absolute coordinates decided at the step S56 is extracted as an occupied region of a graphic on the mesh region.

At a step S57C, presence (Yes/No) of the extraction of all the basic element data is checked. If the basic element data are not extracted, the processing returns to the step S52. Subsequently, the processing of the steps S52 to S57 is repeated for all the basic element data and a decision of Yes is then obtained at the step S57C, and the processing proceeds to a step S58.

At the step S58, in the case in which two graphics overlap each other on the same region, the overlapping portion is generated as a graphic for subtraction.

At a step S59, next, an area of the graphic for subtraction which is obtained at the step S58 is subtracted from a simple overlapping area obtained by simply adding the occupied region extracted at the step S57. Consequently, the occupied area in the selected mesh region can be calculated easily and accurately. In this case, individual occupied regions themselves are not transformed. Therefore, shapes of the individual occupied regions are not complicated.

Then, presence of an end of the calculation of occupation rates in all the mesh regions is checked at a step S59C. Moreover, if it is decided that there is a mesh region in which the calculation is not ended, a new mesh region is selected at a step S59M and the processing then returns to the step S52.

Thereafter, when it is decided that the calculation of the occupation rates in all the mesh regions is ended at the step S59C, the calculation of the whole occupation rate is carried out based on the occupation rate in each of all the mesh regions at a step S60 and the processing is ended.

In the case in which the occupation rate calculation is carried out by the existing hierarchical structure layout data DH in the same manner, it is necessary to expand the hierarchical structure into flat data. Therefore, a processing time required for the expansion and an intermediate file (a work region) become enormous and the processing cannot be carried out in some cases.

On the other hand, in the present embodiment, the processing can be started from the basic element data of the reverse hierarchical structure layout data RDH. Consequently, a processing of retrieving cell data can easily be carried out and the occupation rate calculation can be performed at a high speed.

In the fifth embodiment, moreover, there is provided the reciprocal hierarchical data converting section 20 for converting the hierarchical structure layout data DH into the reverse hierarchical structure layout data RDH. Therefore, it is possible to calculate an occupation rate at a high speed in the same manner also in the case in which the hierarchical structure layout data DH are given.

<Sixth Embodiment>

Figure 14:
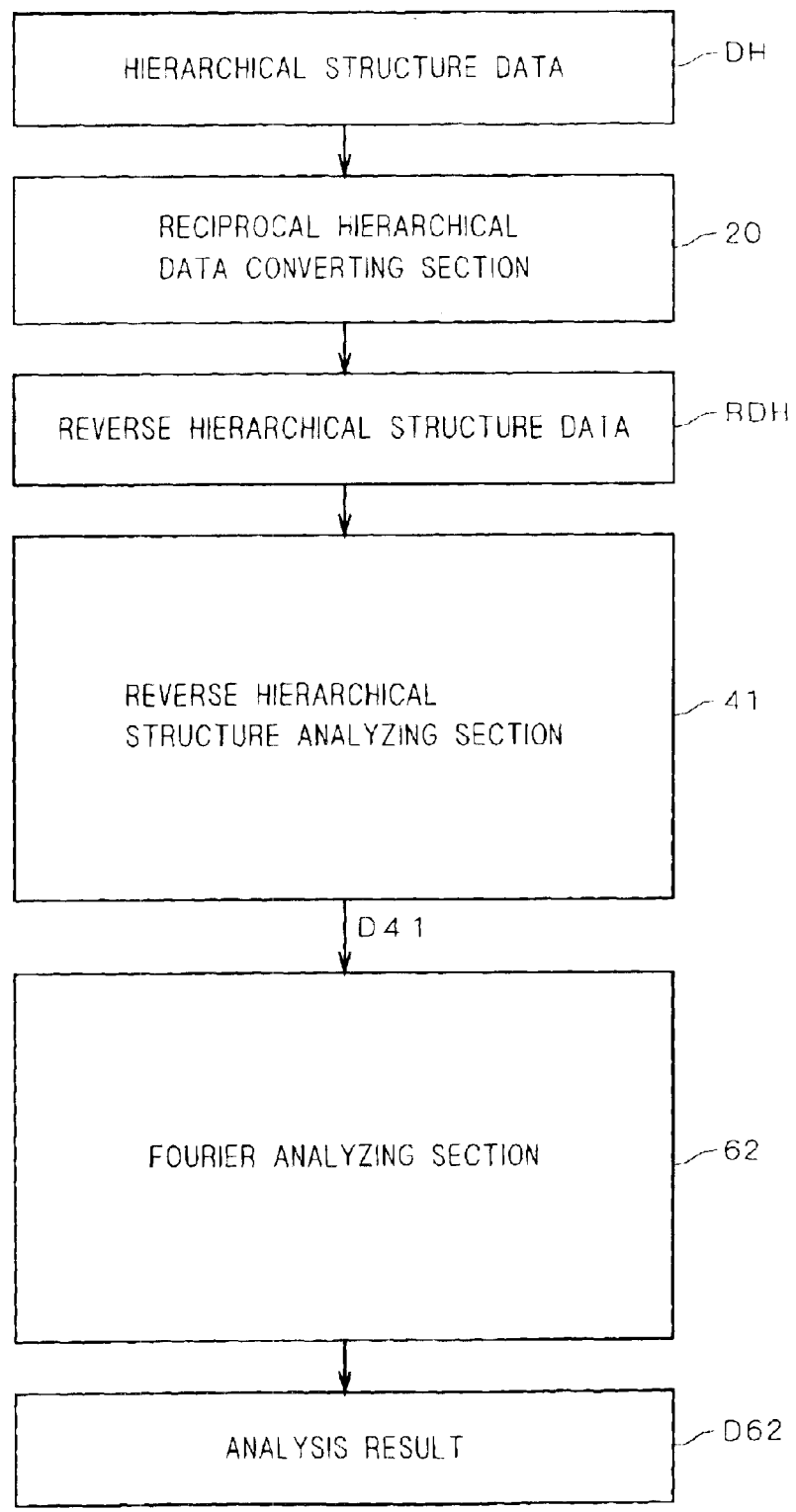
FIG. 14 is a block diagram showing a structure of a Fourier analyzing device according to a sixth embodiment of the present invention.

FIG. 14 is a block diagram showing a structure of a Fourier analyzing device according to a sixth embodiment of the present invention. As shown in FIG. 14, a reverse hierarchical structure analyzing section 41 receives reverse hierarchical structure layout data RDH and outputs reverse hierarchical structure analyzing information D41 based on the reverse hierarchical structure layout data RDH. A Fourier analyzing section 62 to be a graphic verifying section outputs an analysis result D62 based on the reverse hierarchical structure analyzing information D41.

The Fourier analyzing device may employ a structure in which the reverse hierarchical structure layout data RDH are directly used or a structure in which the reverse hierarchical structure layout data RDH obtained by converting existing hierarchical structure layout data DH by means of a reciprocal hierarchical data converting section 20 are used as shown in FIG. 14. The layout data converting device according to the second embodiment corresponds to the reciprocal hierarchical data converting section 20.

Figure 15:
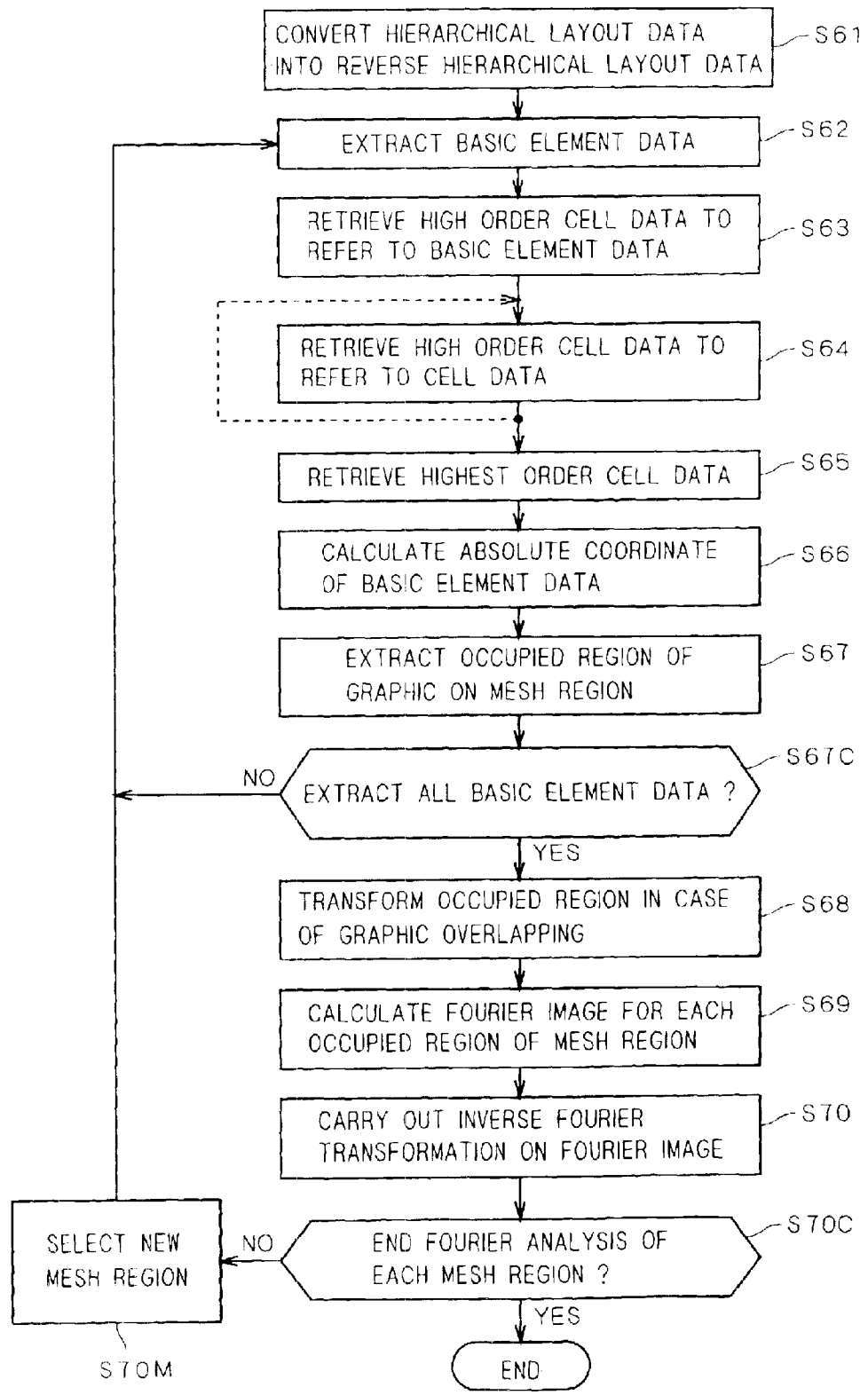
FIG. 15 is a flow chart showing a Fourier analyzing operation of the Fourier analyzing device according to the sixth embodiment.

FIG. 15 is a flow chart showing a Fourier analyzing operation of the Fourier analyzing device according to the sixth embodiment. FIG. 15 corresponds to the structure of FIG. 14 utilizing the existing hierarchical structure layout data DH. With reference to FIG. 15, the Fourier analyzing operation will be described below.

First of all, at a step S61, the hierarchical structure layout data DH are converted into the reverse hierarchical structure layout data RDH by the reciprocal hierarchical data converting section 20.

Subsequently, the same reverse hierarchical structure analysis processing as that of the fourth embodiment is carried out based on the reverse hierarchical structure layout data RDH by the reverse hierarchical structure analyzing section 41. More specifically, the contents of the processing of steps S62 to S65 in FIG. 15 are the same as those of the steps S42 to S45 in FIG. 11.

When the highest order cell data are retrieved at the step S65, an actual space region to be defined by the highest order cell data is determined. A graphic defined by at least one basic element data is used in the actual space region. Therefore, the actual space region becomes an object of the Fourier analysis processing to be one of graphic verifications.

Subsequently, there is started the Fourier analysis processing based on the reverse hierarchical structure analyzing information D41 by the Fourier analyzing section 62.

First of all, at a step S66, absolute coordinates of the basic element data are calculated. Coordinate positions of the basic element data on an actual space region are determined based on region information about all the cell data from the basic element data to the highest order cell data.

At a step S67, an overlapping region of a selected mesh region in the actual space region and a graphic having coordinate positions decided at the step S66 is extracted as an occupied region.

At a step S67C, presence (Yes/No) of the extraction of all the basic element data is checked. If the basic element data are not extracted, the processing returns to the step S62. Subsequently, the processing of the steps S62 to S67 is repeated for all the basic element data and a decision of Yes is then obtained at the step S67C, and the processing proceeds to a step S68.

At the step S68, in the case in which two graphics overlap each other on the same region, an occupied region transformation processing of removing the overlapping portion from an occupied region of one of the graphics is carried out.

At a step S69, then, a Fourier image in the selected mesh region is calculated based on the occupied region obtained through the steps S67 and S68. In this case, the occupied region transformation processing is carried out at the step S68. Also in the case in which two or more graphics occupy the same region, therefore, it is possible to accurately determine the occupied region by simply adding the occupied region of each graphic.

Thereafter, the Fourier image is subjected to inverse Fourier transformation at a step S70. Thus, a result of the Fourier analysis processing becomes an analysis result D62 on a mesh region unit at the steps S69 and S70.

Subsequently, presence of an end of the Fourier analysis processing in all the mesh regions is checked at a step S70C. Moreover, if it is decided that there is a mesh region in which the calculation is not ended, a new mesh region is selected at a step S70M and the processing then returns to the step S62.

Thereafter, when it is decided that the analysis of all the mesh regions is ended at the step S70C, the processing is completed.

In the case in which the Fourier analysis processing is carried out by the existing hierarchical structure layout data DH in the same manner, it is necessary to expand the hierarchical structure into flat data. Therefore, a processing time required for the expansion and an intermediate file (a work region) become enormous and the processing cannot be carried out in some cases.

On the other hand, in the present embodiment, the basic element data of the reverse hierarchical structure layout data RDH are used. Consequently, the processing of retrieving cell data can easily be carried out and the Fourier analysis can be performed at a high speed. In addition, it is possible to analyze a physical phenomenon at a comparatively long distance by carrying out the Fourier analysis.

In the sixth embodiment, moreover, there is provided the reciprocal hierarchical data converting section 20 for converting the hierarchical structure layout data DH into the reverse hierarchical structure layout data RDH. Therefore, it is possible to carry out the Fourier analysis processing at a high speed in the same manner also in the case in which the hierarchical structure layout data DH are given.

<Seventh Embodiment>

Figure 16:
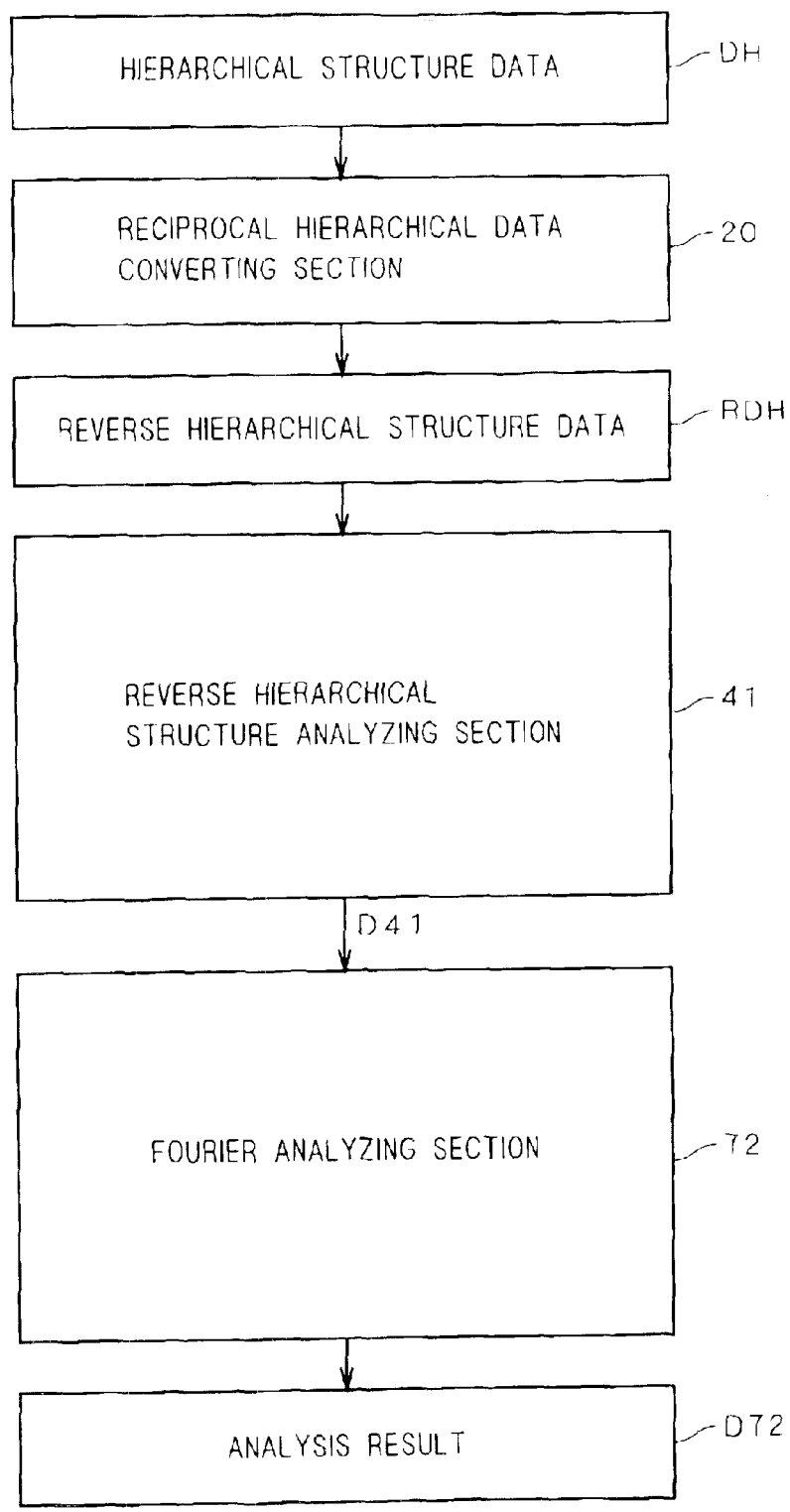
FIG. 16 is a block diagram showing a structure of a Fourier analyzing device according to a seventh embodiment of the present invention.

FIG. 16 is a block diagram showing a structure of a Fourier analyzing device according to a seventh embodiment of the present invention. As shown in FIG. 16, a reverse hierarchical structure analyzing section 41 receives reverse hierarchical structure layout data RDH and outputs reverse hierarchical structure analyzing information D41 based on the reverse hierarchical structure layout data RDH. A Fourier analyzing section 72 outputs an analysis result D72 based on the reverse hierarchical structure analyzing information D41.

The Fourier analyzing device may employ a structure in which the reverse hierarchical structure layout data RDH are directly used or a structure in which the reverse hierarchical structure layout data RDH obtained by converting existing hierarchical structure layout data DH by means of a reciprocal hierarchical data converting section 20 are used as shown in FIG. 16. The layout data converting device according to the second embodiment corresponds to the reciprocal hierarchical data converting section 20.

Figure 17:
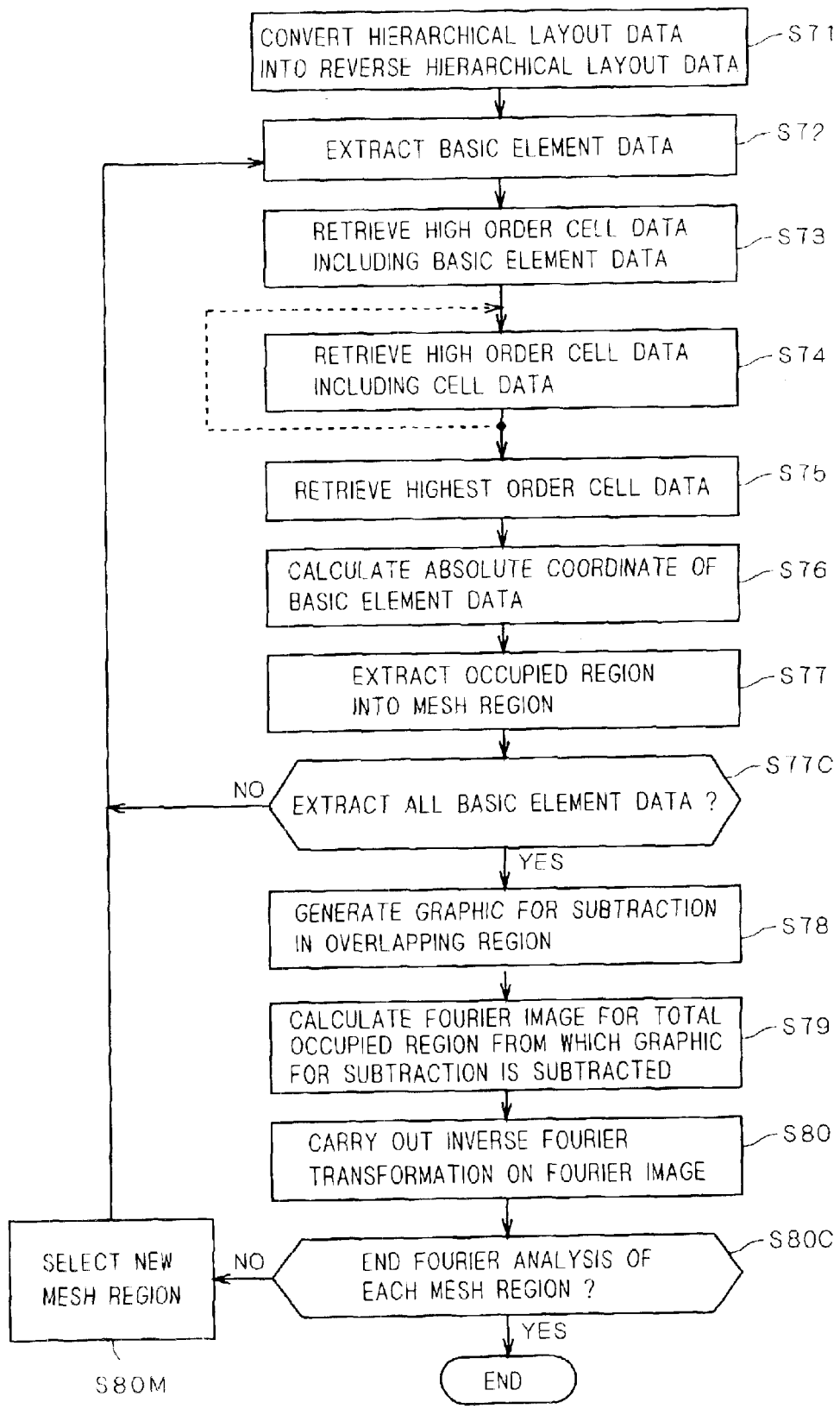
FIG. 17 is a flow chart showing a Fourier analyzing operation of the Fourier analyzing device according to the seventh embodiment.

FIG. 17 is a flow chart showing an occupation rate calculating operation of the Fourier analyzing device according to the seventh embodiment. FIG. 17 corresponds to the structure of FIG. 16 utilizing the existing hierarchical structure layout data DH. With reference to FIG. 17, the Fourier analyzing operation will be described below.

First of all, at a step S71, the hierarchical structure layout data DH are converted into the reverse hierarchical structure layout data RDH by the reciprocal hierarchical data converting section 20.

Subsequently, the same reverse hierarchical structure analysis processing as that of the fourth embodiment is carried out based on the reverse hierarchical structure layout data RDH by the reverse hierarchical structure analyzing section 41. More specifically, the contents of the processing of steps S72 to S75 in FIG. 17 are the same as those of the steps S42 to S45 in FIG. 11.

When the highest order cell data are retrieved at the step S75, an actual space region to be defined by the highest order cell data is determined. A graphic defined by at least one basic element data is used in the actual space region. Therefore, the actual space region becomes an object of the Fourier analysis.

Subsequently, there is started the Fourier analysis processing based on the reverse hierarchical structure analyzing information D41 by the Fourier analyzing section 72.

First of all, at a step S76, absolute coordinates of the basic element data are calculated. Coordinate positions of the basic element data on an actual space region are determined based on region information about all the cell data from the basic element data to the highest order cell data.

At a step S77, an overlapping region of a selected mesh region in the actual space region and a graphic having coordinate positions determined at the step S76 is extracted as an occupied region.

At a step S77C, presence (Yes/No) of the extraction of all the basic element data is checked. If the basic element data are not extracted, the processing returns to the step S72. Subsequently, the processing of the steps S72 to S77 is repeated for all the basic element data and a decision of Yes is then obtained at the step S77C, and the processing proceeds to a step S78.

At the step S78, in the case in which two graphics overlap each other on the same region, the overlapping portion is generated as a graphic for subtraction.

At a step S79, next, an area of the graphic for subtraction which is obtained at the step S78 is subtracted from a simple overlapping area obtained by simply adding the occupied region extracted at the step S77. Consequently, a total occupied region in the selected mesh region can be obtained easily and accurately and a Fourier image in the total occupied region is calculated. In this case, individual occupied regions themselves are not transformed. Therefore, shapes of the individual occupied regions are not complicated.

Thereafter, the Fourier image is subjected to inverse Fourier transformation at a step S80. A result obtained by the processing of the steps S78 and S79 becomes an analysis result D72.

Subsequently, presence of an end of the calculation of occupation rates in all the Fourier mesh regions is checked at a step S80C. Moreover, if it is decided that there is a mesh region in which the Fourier analysis is not ended, a new mesh region is selected at a step S80M and the processing then returns to the step S72.

Then, when it is decided that the analysis of all the mesh regions is ended at the step S80C, the processing is completed.

In the case in which the Fourier analysis is to be carried out by the existing hierarchical structure layout data DH in the same manner, it is necessary to expand the hierarchical structure into flat data. Therefore, a processing time required for the expansion and an intermediate file (a work region) become enormous and the processing cannot be carried out in some cases.

On the other hand, in the present embodiment, the basic element data of the reverse hierarchical structure layout data RDH are used. Consequently, the processing of retrieving cell data can easily be carried out and the Fourier analysis processing can be performed at a high speed.

In the seventh embodiment, moreover, there is provided the reciprocal hierarchical data converting section 20 for converting the hierarchical structure layout data DH into the reverse hierarchical structure layout data RDH. Therefore, it is possible to carry out the Fourier analysis processing at a high speed in the same manner also in the case in which the hierarchical structure layout data DH are given.

While the invention has been shown and described in detail, the foregoing description is in all aspects illustrative and not restrictive. It is therefore understood that numerous modifications and variations can be devised without departing from the scope of the invention.

What is claimed is:

1. A method of saving layout data comprising a plurality of basic element data, each of which directly defines a graphic to be a layout pattern of a component of a semiconductor device and a plurality of cell data constructed by a hierarchical structure such that reference can be finally made to said basic element data, saving said layout data in such a format as to define said hierarchical structure in a reverse direction from a low order to a high order by relating to parent cell information indicative of high order cell data to which reference is directly made to each of said plurality of basic element data and said plurality of cell data, wherein, said plurality of cell data includes intermediate level cell data and highest order cell data, and the order of data of said hierarchical structure, from highest to lowest, is said basic element data, said intermediate level cell data, and said highest order cell data.

* * * * *